United States Patent [19]

Gale et al.

[11] Patent Number: 4,668,080
[45] Date of Patent: May 26, 1987

[54] METHOD AND APPARATUS FOR FORMING LARGE AREA HIGH RESOLUTION PATTERNS

[75] Inventors: Michael T. Gale, Wettswil; Hans P. Kleinknecht, Bergdietikon; Karl H. Knop, Zurich, all of Switzerland

[73] Assignee: RCA Corporation, Princeton, N.J.

[21] Appl. No.: 803,006

[22] Filed: Nov. 29, 1985

[51] Int. Cl.[4] .................. G03B 27/48; G03B 27/50; G03B 27/70
[52] U.S. Cl. .......................................... 355/51; 354/4; 355/77
[58] Field of Search .................. 430/321; 354/4; 250/492.2; 355/22, 51, 77, 33, 20

[56] References Cited

U.S. PATENT DOCUMENTS

| | | | |
|---|---|---|---|
| 3,316,805 | 5/1967 | Cary | 355/334 |
| 4,092,654 | 5/1978 | Alasia | 355/22 X |
| 4,390,789 | 6/1983 | Smith et al. | 250/492.2 |
| 4,464,030 | 8/1984 | Gale et al. | 354/4 |
| 4,524,127 | 6/1985 | Kane | 430/321 |
| 4,528,260 | 7/1985 | Kane | 430/321 |

OTHER PUBLICATIONS

Patent application of H. P. Kleinknecht, Ser. No. 754,134, "Optical Imager with Diffractive Lenticular Array", filed Jul. 12, 1985.

Primary Examiner—Richard A. Wintercorn
Attorney, Agent, or Firm—Joseph S. Tripoli; Donald S. Cohen

[57] ABSTRACT

A high resolution periodic pattern is formed in a layer of a photosensitive material by means of a beam of light and a lenticular array formed of a plurality of lenslets. The lenticular array is positioned over the layer and the beam of light is directed through the lenticular array onto the layer. The beam of light is scanned across the lenticular array to pass through the individual lenslets which defines the light into a fine beam and thereby exposes a small area of the layer. The beam is shaped to achieve a periodic pattern in the layer as the beam scans across the layer. By moving the layer in synchronism with the scanning, a two dimensional array of the pattern can be obtained.

25 Claims, 11 Drawing Figures

METHOD AND APPARATUS FOR FORMING LARGE AREA HIGH RESOLUTION PATTERNS

The present invention relates to a method and apparatus for forming high resolution patterns, i.e. patterns having line widths under about 10 micrometers, over a large area, i.e. areas with dimensions greater than about 150 millimeters.

BACKGROUND OF THE INVENTION

In the electronic industry there is a growing number of new products in display and related areas which are fabricated by high resolution lithography, having patterns whose dimensions are on the order of micrometers, applied over relatively large areas, in the order of 150 to 300 millimeters square. For example, there is an increasing interest in liquid crystal displays (LCDs) for television and computer terminal displays. A typical LCD panel may have 400 by 600 identical pixels, each of 0.5 by 0.5 millimeter in size, covering a total area of 200 by 300 millimeters. Each pixel may have an active element, such as a metal-insulator-metal (MIM) diode device or a thin film transistor (TFT) circuit, the structure of which has critical dimensions in the 1 to 10 micrometers range. The pixels are formed of layers of various materials, such as metals, insulators, and semiconductor materials, which are defined to shapes and sizes corresponding to the elements of the pixel. The layers are defined by a technique which includes coating the layer with a photoresist material and patterning the photoresist using photolithographic techniques. Typically, only a small portion of the total area needs to be exposed at any one time. The exposure system required in the photolithographic fabrication steps must thus be capable of imaging a periodic array of micron size features over a large area with tight tolerances of the feature size and positions. In addition, any practical fabrication process must be capable of high throughput, with exposure times in the order of tens of seconds per panel.

Contact printing techniques, using high resolution, large area masks, can in principle satisfy the above requirements. However, contact printing suffers from the problem of damaged substrate or mask as a result of the intimate contact under pressure required to achieve the high resolution. Non-contact printing requires a lens which is capable of imaging the micrometer dimension features over the large area. Although there are lenses which will have the desired resolution, they are only capable of providing the micron resolution over small areas, about 1 cm$^2$. Although it is theoretically possible to have a single lens which could provide the desired resolution over the large field area, such lenses would be very large and complex to design and build. Another problem is to achieve accurate focusing of the lens over the large area, particularly if the substrate does not have a completely flat surface.

In the semiconductor industry, where this problem has arisen with regard to making integrated circuits of small feature size on wafers as large as 150 millimeters in diameter, the solution chosen has been to develop wafer-steppers. In wafer-steppers, a high performance lens images a single field at a time of about 1 cm$^2$ in area, and the total area is exposed by multiple exposures while moving or stepping the wafer across the lens using an accurate x-y translation stage. However, such systems are not capable of high throughput for large area substrates because of the settling and alignment time involved in each step. Printing by means of a focused laser beam scanned across the photoresist through a mechanical or electrical deflection system is subject to the same resolution versus area considerations as lens imaging. High resolution can be achieved by x-y translation of the substrate under high performance focusing optics, but again the translation times involved are not compatible with high throughput systems.

SUMMARY OF THE INVENTION

A pattern is formed in a layer of light sensitive material by placing an array of lenslets over the layer. A beam of light is generated and directed through the array of lenslets onto the layer. The beam of light is moved across the array of lenslets so that the beam passes through the individual lenslets in succession so as to successively expose small dimensional areas of the layer. The beam of light is shaped to expose one pattern of the layer as the beam is scanned across the layer.

DETAILED DESCRIPTION OF PREFERRED EMBODIMENT

Figure 1:
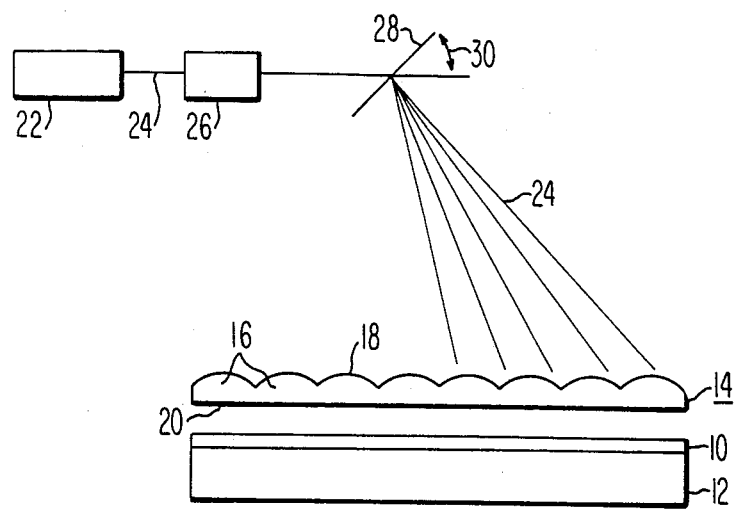
FIG. 1 is a schematic view illustrating the method of the present invention for forming a pattern in a layer.

Referring initially to FIG. 1, the method of the present invention will be described with regard to forming a pattern in a layer 10 of a photoresist material which is on the surface of a substrate 12. A lenticular array 14 made up of a linear array of lenslets 16, is mounted over the photoresist layer 10 with the array 14 being spaced from and parallel to the photoresist layer 10. The lenticular array 14 shown in FIG. 1 is made up of a plurality of individual lenslets 16 each having a convex surface 18 opposite a flat surface 20. However, it should be understood that each lenslet 16 can be a cylindrical or spherical lens or can be a more complex imaging element, such as a hologram or other diffractive structure. An example of a lenticular array and methods of fabricating the array is described in U.S. Pat. Nos. 4,524,127 to J. Kane, entitled "Method Of Fabricating A Silicon Lens Array", issued June 18, 1985, 4,528,260 to J. Kane, entitled "Method Of Making Lenticular Arrays" issued July 9, 1985 and 4,464,030 to M. T. Gale et al., entitled "Dynamic Accuracy X-Y Positioning Table For Use In A High Precision Light-Spot Writing System" issued Aug. 7, 1984. A source of light 22, such as a laser, directs a beam of light 24 through a beam forming optics 26 and onto a mirror 28. The mirror 28 reflects the beam of light 24 onto the photoresist layer 10 through the lenticular array 14. The mirror 28 can be pivoted, as indicated by the double-headed arrow 30, so as to scan the beam of light 24 across the photoresist layer 10 through the individual lenslets 16 of the lenticular array 14.

Figure 2:
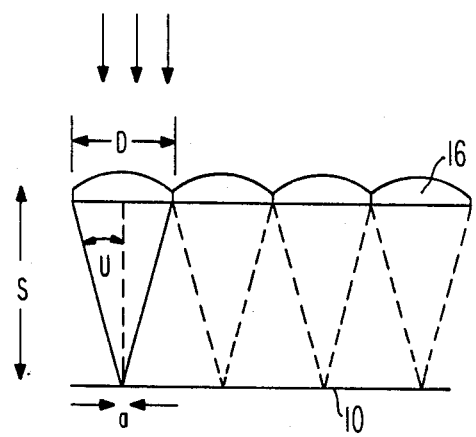
FIG. 2 is a schematic view illustrating the manner in which the method of the present invention operates.

To form periodic patterns in the photoresist layer 10, the lenslets 16 of the lenticular array 14 are fabricated to match the period of the particular pattern. As indicated in FIG. 2, each lenslet 16 projects the required image for a single element of the pattern. The resolution as defined by smallest dimension, a, which can be imaged by a single spherical lenslet 16, is given by the numerical aperture of the imaging optics as follows:

Numerical aperture (NA)=D/2S
Resolution (a)=0.61 W/NA
where D=lenslet diameter
S=lens to image plane separation
W=wavelength of illumination light.

For example, for an assembly in which the lens to image plane separation (S) is 2 millimeters, the lenslet diameter (D) is 500 micrometers and the light source is a helium cadmium laser which emits light at wavelength of 442 nanometers, a resolution (a) of about 2 micrometers is obtainable for a perfect lenslet. This high resolution is possible because each lenslet 16 covers only a small image field and can thus operate with a small lens to substrate separation giving a relatively high numerical aperture. The depth of focus (d) of the image provided by the lenticular array 14 is obtained by $$d=0.3\ W/(NA)^2.$$

For the above example, the depth of focus (d) would be approximately ±10 micrometers which would be sufficient in most practical applications.

Figure 3:
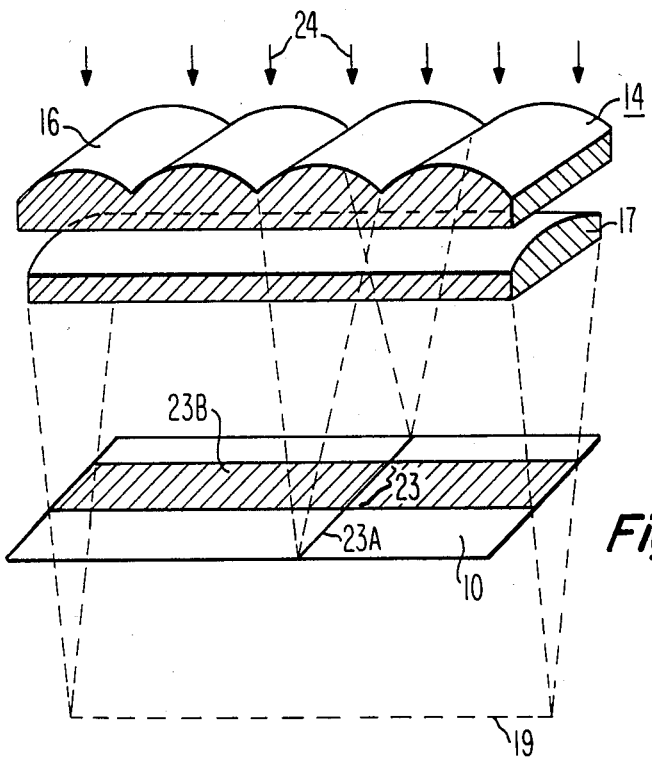
FIG. 3 is a schematic view illustrating one manner of achieving a pattern using the method of the present invention.

As shown in FIG. 2, each spherical lenslet 16 will converge the parallel beam of light passing therethrough to form a point on the photoresist layer 10 so that the parallel beam passing through the lenslets 16 of the lenticular array 14 will generate a pattern of points. Referring to FIG. 3 there is shown one method of achieving a pattern which is not merely points, in this case the pattern is formed of lines. To form the pattern of lines, a lenticular array 14 made up of a plurality of cylindrical lenslets 16 is placed across the path of the light beam 24, indicated by the arrows, parallel to the photoresist layer 10. A single cylindrical lens 17 is placed between the lenticular array 14 and the photoresist layer 10 and is arranged with its longitudinal axis being perpendicular to the longitudinal axis of the lenslets 16 of the lenticular array 14. As shown, the lenticular array 14 is spaced from the photoresist layer 10 such that the focal line of each lenslet 16 is at the photoresist layer whereas the cylindrical lens 17 is positioned with respect to the photoresist layer 10 such that its focal line is at a distance 19 beyond the photoresist layer 10. Thus, each lenslet 16 converges the parallel light beam 24 to a narrow but relatively long, in the longitudinal direction of the lenslet 16, line 23a at the photoresist layer 10 whereas the cylindrical lens 17 converges the parallel beam 24 to a relatively long line 23b in the longitudinal direction of the lens 17 of defined width at the photoresist 10. Therefore, as the beam passes across the lenslets 16 and along the cylindrical lens 17, a pattern in the form of a row of narrow lines 23 each of defined length will be formed in the photoresist layer 10. Similarly, by positioning the lenticular array 14 so that the focal line of each lenslet 16 is beyond the photoresist layer 10, a plurality of rectangles, instead of lines, can be formed in the photoresist layer 10.

Figure 4:
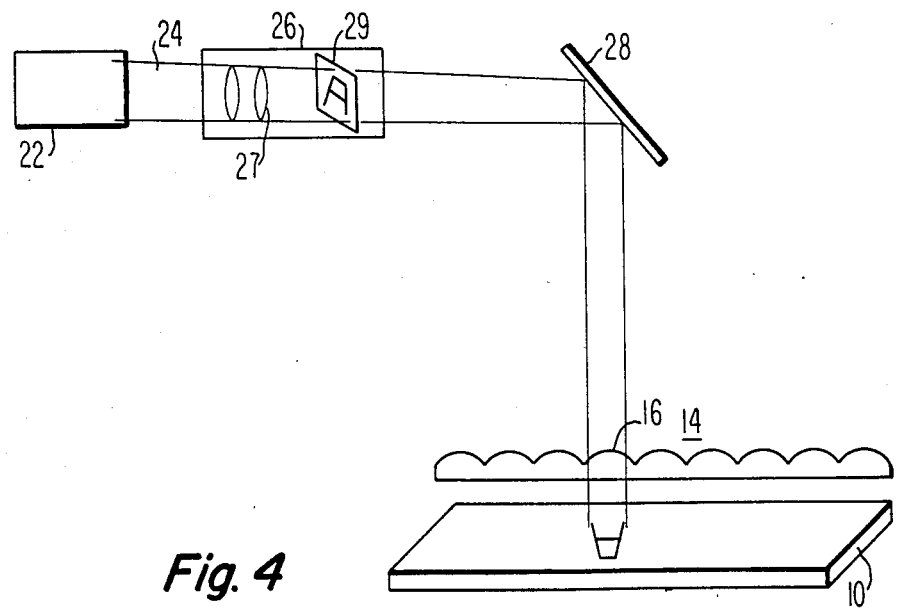
FIG. 4 is a schematic view illustrating another manner of achieving a pattern using the method of the present invention.

Referring to FIG. 4, there is shown another method of forming a pattern in the photoresist layer 10 using the present invention. For this method, the beam forming optics 26 includes a lens system 27 which shapes the light beam 24 to the desired size, and a mask 29 having a desired pattern thereon. The size of the light beam 24 at the place of lenticular array 14 should be at least as large as one lenslet 16. As shown, the mask 29 contains a pattern in the form of the letter "A". However, it can be of any pattern to be repetitiously produced on the photoresist layer 10, such as a pattern of a semiconductor device. The light beam 24 which passes through the size forming lens 27 and mask 29 is reflected by the mirror 28 through a lenslet 16 of the lenticular lens 14 onto the photoresist layer 10. The lenslet 16 produces the reflected image of the "A" from the mask 29 onto the photoresist layer 10. As the light beam 24 is scanned across the lenticular array 14 by the pivoting mirror 28, a pattern of a line of the "A"'s are formed in the photoresist layer 10.

Although the lenticular array has been described as being formed of a series of lenslets of the type shown in the Kane U.S. Pat. Nos. 4,524,127 and 4,528,260, other types of lenses can be used to form the lenticular array. For example, the lenticular array can be formed of a plurality of diffractive lenses. Such a diffractive lens can be formed of a grating structure comprising a plurality of lines, either parallel or concentric, of a material which causes diffraction of the incoming light to give the desired focusing characteristics. One such type of diffractive lens is described in the patent application of H. P. Kleinknecht, Ser. No. 754,134 entitled "Optical Imager With Diffractive Lenticular Array", filed July 12, 1985.

Figure 8:
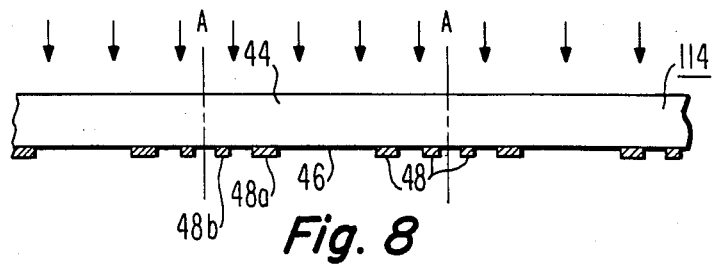
FIG. 8 is a sectional view illustrating another type of lenticular array that can be used in the method of the present invention.
Figure 9:
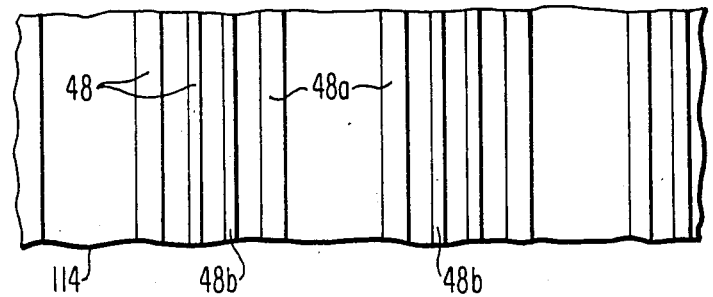
FIG. 9 is a top view of the lenticular array shown in FIG. 8.

Referring to FIGS. 8 and 9 one type of diffractive lenticular array 114 includes a substrate 44 of a material which is transparent to the incoming radiation being used, such as glass or quartz. On the surface 46 of the substrate 44 are a plurality of spaced, parallel stripes 48 of either an opaque or transparent material. Preferably, the stripes 48 are of a transparent material which has a high refractive index, such as zinc sulfide, which provide a true phase structure with a high efficiency. The stripes 48 are arranged in a repetitive pattern with each pattern extending along a separate column of pixels of the pattern to be formed. In each pattern of the stripes 48, the line width, i.e. the width of the stripe 48, and the period, i.e. the spacing between stripes 48, is large in the center of the pattern and gets smaller moving in each direction from the center of the pattern toward the edge of the pattern. For example, as shown in FIGS. 8 and 9, a pattern is formed by the stripes 48 between the dashed lines A—A. In this pattern, the stripes 48a which are closest to the center of the pattern are spaced apart a relatively large distance, whereas the spacing between each of the stripes 48a and the next adjacent stripe 48b in the direction away from the center of the pattern is much smaller. Also, the stripes 48a are wider than the stripes 48b. This pattern results in a weak diffraction for the light falling on the center of the pattern and a stronger diffraction of the light incident closer to the edges of the pattern. The distribution of line widths and spacings of the stripes 48 can be designed such that with an incident plane wave, all first diffraction orders going towards the center of the pattern, will meet along one focal line. The theory for such a design can be obtained from a textbook on optics, such as M. Born and E. Wolf, "Principles of Optics", Pergamon Press, Oxford 1965.

The diffractive lenticular array 114 can be made by applying a layer of the material of the stripes 48 on one surface 46 of the substrate 44 using any well-known deposition technique for the particular material being used. A layer of a photoresist can then be coated over the material layer and, using standard photolithographic techniques, defined to form areas which extend over the portions of the material layer which will form the stripes. The uncovered portions of the material layer are then removed using any suitable etching technique to leave the stripes of the material on the substrate. The photoresist material can then be removed with a suitable solvent.

Another method of forming the lenticular array 114 is by the well known lift-off technique. For this technique a layer of photoresist is applied to the surface of the substrate and is defined, using standard photolithographic techniques, to have openings therein of the desired shape, size and location of the stripes 48. The material for the stripes 48 is then coated over the photoresist layer and on the surface of the substrate exposed by the openings in the photoresist layer. The photoresist is then removed with a suitable solvent which removes the material on the photoresist leaving the stripes 44 on the substrate.

Figure 10:
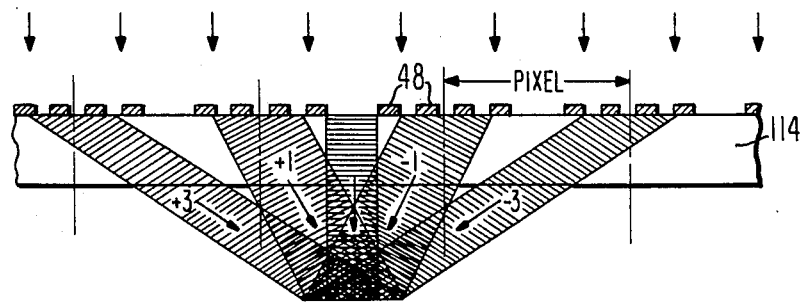
FIG. 10 is a sectional view of a modification of the lenticular array shown in FIG. 8.

In the lenticular array 114 shown in FIGS. 8 and 9, the pattern of the stripes 48 is designed to diffract the radiation toward a common focal line. However, it is also possible to design the pattern to concentrate the radiation into an extended region. As shown in FIG. 10, this is accomplished by having a pattern of the stripes 48 which has a constant period grating near the edges of the pixels with a large bare space in the center of the pixel. The bare center portion allows the light passing therethrough to pass directly to the photoresist layer 10. The pattern with constant period grating at the edges utilizes not only the light passing directly to the photoresist layer 10 through the bare center portion, but it diffracts the positive and negative first orders to the photoresist layer 10 adjacent to the grating towards the right and left hand side of the grating area, respectively. Similarly, the positive and negative third orders are diffracted to the detector areas next to the adjacent grating, the fifth orders are diffracted to the second next detector areas and so on for all odd orders.

Another type of lenticular array can be in the form of a hologram which will reconstruct the desired pattern on the photoresist layer 10 when the light beam is directed therethrough. As is well known, a hologram is recorded as the interference pattern between coherent light passing through a mask corresponding to the desired pattern and a reference beam. The hologram will reconstruct the same pattern when illuminated by the conjugate, the reverse wave front and direction, of the reference beam. Thus, a substrate having a plurality of the hologram of the desired pattern thereon, can be used as the lenticular array. If the pattern to be formed in the photoresist layer 10 is not too complex, the hologram can be a computer generated hologram. Computer generated holograms and methods of forming them are described in "Computer-Drawn Modulated Zone Plates" by A. Engel and G. Herziger, *Applied Optics* (1973), Vol. 12, pg. 471 and "Topics in Applied Physics 41" edited by B. R. Frieden, 1980, chapter by Dallas on computer generated holograms, "Optical Holography" by Robert J. Collier et al., 1971, Ch. 19, pp. 542-563. After computing the interference pattern which is to form the hologram, the hologram is fabricated by writing the computed pattern onto a substrate, such as a photographic plate or film, using a precise, high resolution optical recording system. The resulting recording is essentially identical to the classical recorded hologram and will reconstruct the image pattern when illuminated by the correct reference beam. Thus, the recorded hologram can be used as the lenticular array to form a pattern on the photoresist layer 10.

Figures 5, 6:
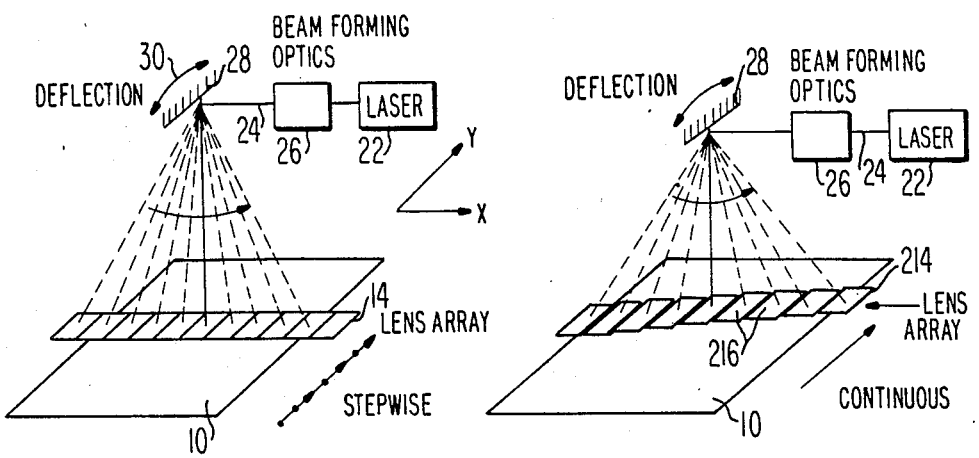
FIG. 5 is a schematic view illustrating an apparatus for forming a pattern over a large area using the method of the present invention.
FIG. 6 is a schematic view illustrating another apparatus for forming a pattern over a large area using the method of the present invention.

FIG. 5 shows one method of the present invention for obtaining a two dimensional array of the pattern image. The laser 22 directs the beam of light through a beam forming optic system 26 which shapes the beam such that the beam size at the plane of the lenticular array 14 is at least as large as one lenslet 16. The beam 24 is then reflected by the mirror 28 onto the photoresist layer 10 through the lenticular array 14. The mirror 28 is pivoted by a suitable mechanism, such as a galvanometer mirror deflection unit or some other mechanical or electrical means, so that the beam 24 scans across the photoresist layer 10 in the x direction and passes through each of the lenslets 16 in succession. During a scan of one line, each lenslet 16 produces an image pattern on the photoresist layer 10 determined by either a mask in the beam forming optics 26 or by the lenticular array 14. Thus, one scan images a periodic array of the patterns, each with a high resolution and accurate positioning. To obtain a two dimensional array of these images, the substrate 12 is translated in the y direction in a stepwise fashion synchronously with the line scan. Thus, after each line scan, the substrate 10 is moved one step in the y direction.

FIG. 6 shows another form of the method of the present invention for achieving a two dimensional array of images. The system shown in FIG. 6 is the same as that shown in FIG. 5 except that in the lenticular array 214, the lenslets 216 are displaced slightly from the adjacent lenslets in the y axis. Also, the scan of the beam 24 is along a line which is at a angle to the x axis so that the beam scans along the lenslets 216 of the lenticular array 214. In addition, the substrate carrying the photoresist layer 10 is moved in a continuous manner along the y axis. Thus, each scan of the beam 24 along the lenticular array 214 will achieve a line of the patterns across the photoresist layer 10 in the x direction while moving the photoresist layer 10 continuously in the y direction. This would provide a higher throughput than the form shown in FIG. 5 where the photoresist layer is moved in a stepwise fashion in the y direction.

Figure 7:
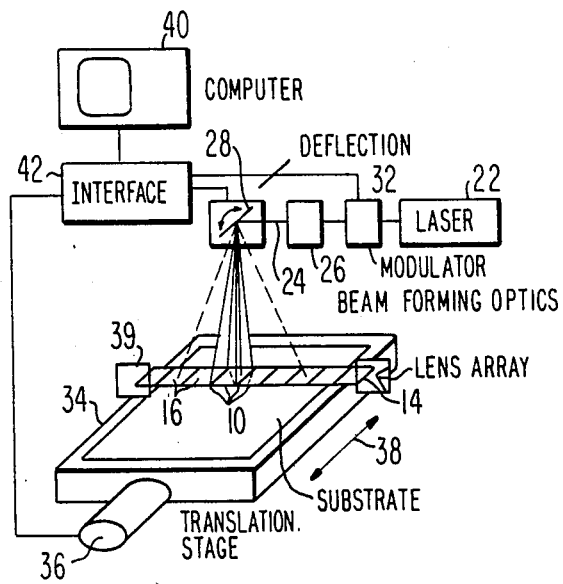
FIG. 7 is a schematic view of an apparatus which can be used to carry out the method of the present invention.

FIG. 7 shows a more complete system for carrying out the method of the present invention. The laser 22 directs its emitted beam of light 24 first through the modulator 32 and then through the beam forming optics 26. The modulator 32 controls the intensity of the light beam 24 and the beam forming optics 26 provides a beam of the desired size. The beam 24 then passes onto the mirror 28 which deflects the beam through the lenslets 16 of the lenticular array 14 onto the photoresist layer 10 which is on the substrate. The substrate is on a translation stage 34 which includes means 36 for moving the substrate in the y direction as indicated by the double-headed arrow 38. The mirror 28 has means for pivoting it so as to scan the beam across the lenticular array 14. The lenticular array 14 has attached thereto focusing means 39 which will move the lenticular array 14 toward or away from the photoresist layer 10 if the distance therebetween varies because the surface of the substrate 12 is uneven. The focusing means 39 may include a light source which directs a beam of light toward the substrate surface, means for detecting the light reflecting from the substrate surface and means, such as a computer 40, for determining variations in the detected light and accordingly causing the lenticular array 14 to move toward or away from the substrate and thereby maintain the correct focusing of the lenticular array on the photoresist layer 10. The modulator 32, means for pivoting the mirror 28 and the means 36 for moving the translation stage 34 are connected to a computer 40 through an interface 42. The computer 40 coordinates the scan of the light beam 24 and the means for moving the translation stage 34 as well as the modulator 32. Thus, as the beam is scanned across the photoresist layer 10 through the lenslets 16, the light beam can be modulated and is shaped to provide the desired pattern in the photoresist layer 10. The translation moving means 36 moves the translation stage either in a stepwise fashion as shown in FIG. 5 or continuously as shown in FIG. 6 to provide the desired pattern over the entire surface of the photoresist layer 10.

Figure 11:
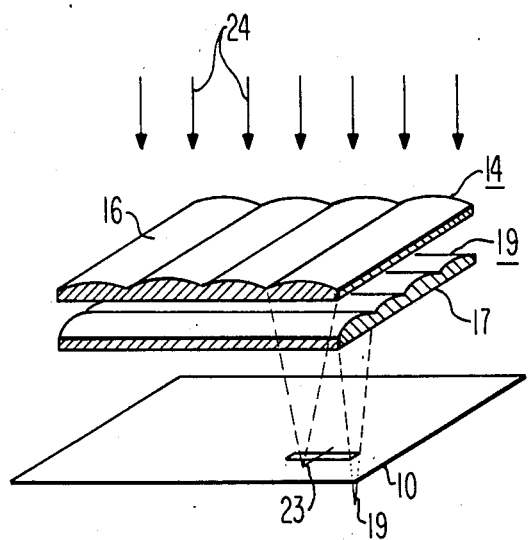
FIG. 11 is a schematic view illustrating another manner of achieving a two dimensional pattern with the present invention.

Instead of translating the substrate 12 to achieve a two dimensional array of the patterns, the two-dimensional array can also be achieved by means of the two-dimensional lenslet array (mosaic array) shown in FIG. 11. The two-dimensional lenslet array is similar to the array shown in FIG. 3 except that the single cylindrical lens 17 is replaced with a lenticular array 19 made up of a plurality of cylindrical lenslets 17. In the two dimensional lenslet array, the longitudinal axis of the lenslets 16 of the lenticular array 14 extend along the y axis and the lenslets 17 of the lenticular array 19 extend along the x axis. The beam of light is first scanned across the photoresist layer 10 in the x direction through one of the lenslets 17 of the lenticular array 19. This results in the light passing through each of the lenslets 16 of the lenticular array 14 in succession to form a row of patterns in the photoresist layer 10. The light beam is then deflected to pass through the next adjacent lenslet 17 of the lenticular array 19 and scanned in the x direction to form a second row of the patterns. Thus, instead of moving the substrate 12 after each scan of the light beam, the light beam is deflected to provide a row-by-row scan with the lenslets of the lenticular array 17 confining the beam to a single row and the lenslets of the lenticular array 14 forming the individual patterns across each row.

Thus, there is provided by the present invention a method of using a lenticular array to form a pattern in a layer of a material. The pattern formed is a periodic pattern which can be formed with a high resolution and small dimensions. Also, the method will form a two dimensional array of the pattern with a high throughput. In addition, the use of the lenticular array allows for dynamic focusing of the lenticular array to compensate for variations in the flatness of the surface of large substrates on which the pattern is being formed.

We claim:

1. A method of forming a pattern in a layer of light sensitive material comprising the steps of
   (a) placing an array of lenslets over the layer;
   (b) generating a beam of light;
   (c) directing said beam of light through the array of lenslets onto said layer;
   (d) moving said beam across the array so that the beam passes through the individual lenslets in succession so as to expose fine dimensional areas of said layer; and
   (e) shaping said light beam to expose a repetitive pattern in said layer as the beam is scanned across the layer.

2. A method in accordance with claim 1 wherein the lenslets of the lenticular array are arranged in a line across the layer and the beam is scanned along said line to form a line pattern of areas in said layer.

3. A method in accordance with claim 2 wherein the beam is scanned a plurality of times across said layer to form a plurality of line patterns in said layer.

4. A method in accordance with claim 3 wherein the layer is moved along with the scanning of the beam to form the plurality of line patterns.

5. A method in accordance with claim 4 wherein the layer is moved in a direction substantially perpendicular to the line of scan of the light beam.

6. A method in accordance with claim 5 wherein the layer is moved incrementally in a stepwise fashion after each line of scan of the light beam.

7. A method in accordance with claim 5 wherein the layer is moved continuously, the line of scan of the beam is along a line at an angle to a line perpendicular to the line of movement of the layer, and the lenslets of the array are arranged in the line along which the beam is scanned.

8. A method in accordance with claim 3 wherein the beam of light is directed through two substantially parallel lenticular arrays each forming a plurality of parallel cylindrical lenslets with the lenslets of one of the arrays being substantially perpendicular to the lenslets of the other array and the beam of light is scanned so that each scan of the beam passes along a separate lenslet of one of the arrays and crosses each of the lenslets of the other array.

9. A method in accordance with claim 2 wherein the beam is shaped by passing it through a cylindrical lens positioned between the array of lenslets and the layer with the axis of the cylindrical lens extending along the path of the movement of the beam.

10. A method in accordance with claim 1 wherein the beam is shaped to a desired pattern by passing the beam through a mask having the pattern thereon prior to passing the beam through the lenticular array.

11. A method in accordance with claim 1 wherein the beam is made of a size at least as large as each lenslet of the lenticular array.

12. Apparatus for forming a pattern in a layer of light sensitive material comprising
    (a) means for emitting a beam of light;
    (b) a lenticular array of a plurality of lenslets mounted over the layer;
    (c) means for directing said beam of light through the lenticular array so that the beam will impinge on said layer;

(d) means for scanning said beam of light across the lenticular array so that the beam will pass through the individual lenslets in succession; and (e) means for shaping said beam of light.

13. Apparatus in accordance with claim 12 including means for supporting said layer and the lenslets of the lenticular array extend in a line across said supporting means.

14. Apparatus in accordance with claim 13 including means for moving said supporting means along a line substantially perpendicular to the line of scan of the light beam.

15. Apparatus in accordance with claim 14 in which the means for moving the support means is adapted to move the support means in incremental steps after each line scan of the beam.

16. Apparatus in accordance with claim 14 in which the means for moving the support means is adapted to move the support means by a continuous motion and the lenslets of the lenticular array are arranged along a line at an angle to the line perpendicular to the line of movement of the support means.

17. Apparatus in accordance with claim 12 including a cylindrical lens between the lenticular array and the layer with the axis of the cylindrical lens extending across the lenslets of the array and along the scanning path of the beam.

18. Apparatus in accordance with claim 17 in which the lenticular array is positioned so that the focal line of each of the lenslets of the array is at the surface of the layer and the cylindrical lens is positioned so that its focal line is beyond the layer.

19. Apparatus in accordance with claim 17 in which the lenticular array and the cylindrical lens are positioned so that the focal line of all the lenses are beyond the layer.

20. Apparatus in accordance with claim 12 including a pair of lenticular arrays each including a plurality of parallel cylindrical lenslets with the lenslets of one of the arrays extending perpendicular to the lenslets of the other array and means for scanning the beam of light along each lenslet of one of the lenticular arrays in succession while passing through each of the lenslets of the other array during each scan.

21. Apparatus in accordance with claim 20 in which the focal line of each of the lenslets of the other array are at the surface on which the pattern is to be formed and the focal line of each of the lenslets of the one array is beyond said surface.

22. Apparatus in accordance with claim 20 in which both lenticular arrays are positioned so that the focal lines of all the lenslets are beyond the surface on which the pattern is to be formed.

23. Apparatus in accordance with claim 12 in which the lenticular array is a diffractive lenticular array having a plurality of stripes of a transparent or opaque material on a surface of a transparent substrate with the stripes being arrayed in a pattern to diffract the beam to a desired shape.

24. Apparatus in accordance with claim 12 in which the beam shaping means includes a mask having a desired pattern thereon.

25. Apparatus in accordance with claim 12 in which the lenticular array is an array of holograms to produce an array of images of the desired shape when the beam passes therethrough.

* * * * *